United States Patent [19]

Wold

[11] E Re. 29,992

[45] Reissued May 8, 1979

[54] INTEGRATING ANALOG-TO-DIGITAL CONVERTER HAVING DIGITALLY-DERIVED OFFSET ERROR COMPENSATION AND BIPOLAR OPERATION WITHOUT ZERO DISCONTINUITY

[75] Inventor: Ivar Wold, Medfield, Mass.

[73] Assignee: Analog Devices, Incorporated, Norwood, Mass.

[21] Appl. No.: 777,690

[22] Filed: Mar. 15, 1977

Related U.S. Patent Documents

Reissue of:

[64] Patent No.: 3,872,466
Issued: Mar. 18, 1975
Appl. No.: 380,690
Filed: Jul. 19, 1973

[51] Int. Cl.[2] ..... H03K 13/20

[52] U.S. Cl. ..... 340/347 NT; 340/347 AD; 340/347 CC; 340/347 M; 324/99 D

[58] Field of Search .... 340/347 M, 347 NT, 347 AD, 340/347 CC; 324/99 D, 130; 235/92 NT

[56] References Cited

U.S. PATENT DOCUMENTS

| | | | |
|---|---|---|---|
| 3,316,547 | 4/1967 | Ammann | 340/347 AD |
| 3,445,839 | 5/1969 | Engelberg et al. | 340/347 AD |
| 3,475,748 | 10/1969 | Price et al. | 340/347 AD |
| 3,500,196 | 3/1970 | Cooper | 324/120 |
| 3,541,320 | 11/1970 | Beall | 235/183 |
| 3,641,563 | 2/1972 | Cushman et al. | 340/347 AD |
| 3,654,560 | 4/1972 | Cath et al. | 328/127 |
| 3,667,055 | 5/1972 | Uchida | 328/127 |
| 3,737,893 | 6/1973 | Belet et al. | 340/347 NT |
| 3,828,347 | 8/1974 | Sacks et al. | 340/347 NT X |

FOREIGN PATENT DOCUMENTS

| | | |
|---|---|---|
| 1190631 | 5/1970 | United Kingdom. |
| 1350753 | 4/1974 | United Kingdom. |
| 1351894 | 5/1974 | United Kingdom. |

OTHER PUBLICATIONS

R. Vautier, Differential Triple-ramp Converter, IBM Technical Disclosure Bulletin, vol. 15, No. 7, Dec. '72, p. 2053.

Dusan Velasevic, Drift Elimination in Integrating A to D Converters, Electronic Engineering, Mar. 1970, vol. 42, No. 505, pp. 49–51.

*Primary Examiner*—Thomas J. Sloyan

*Attorney, Agent, or Firm*—Parmelee, Johnson, Bollinger & Bramblett

[57] ABSTRACT

An analog-to-digital converter of the ramp-integrator type utilizing a special technique to reduce errors due to offset voltages. The integrator first is ramped up and then back to a reference level, by sequential application of opposite-polarity reference signals. A digital determination of net offset error then is made by comparing the total time of ramp-up-and-back with a fixed time period set by a clock generator. During the subsequent conversion operation, integration of the analog signal is controlled in accordance with the amount of net offset error so as to provide a feed-forward error correction. Integration is always in the same direction away from zero for analog signals of either polarity, thus avoiding the effects of discontinuity around zero input.

43 Claims, 6 Drawing Figures

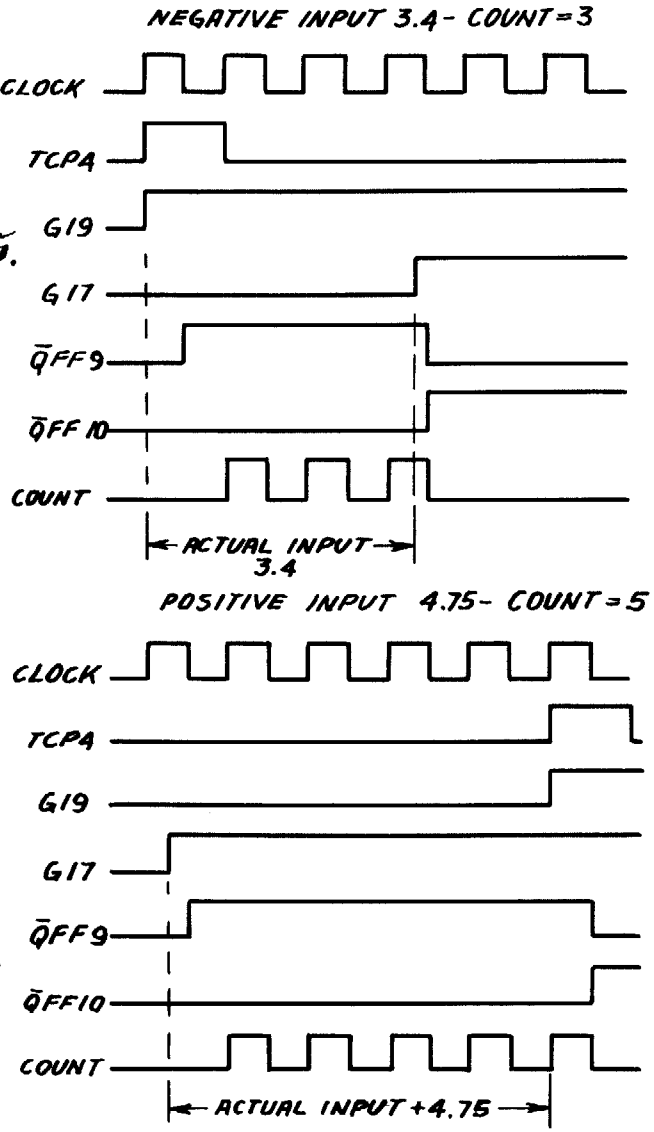
Fig. 5.
Fig. 6.
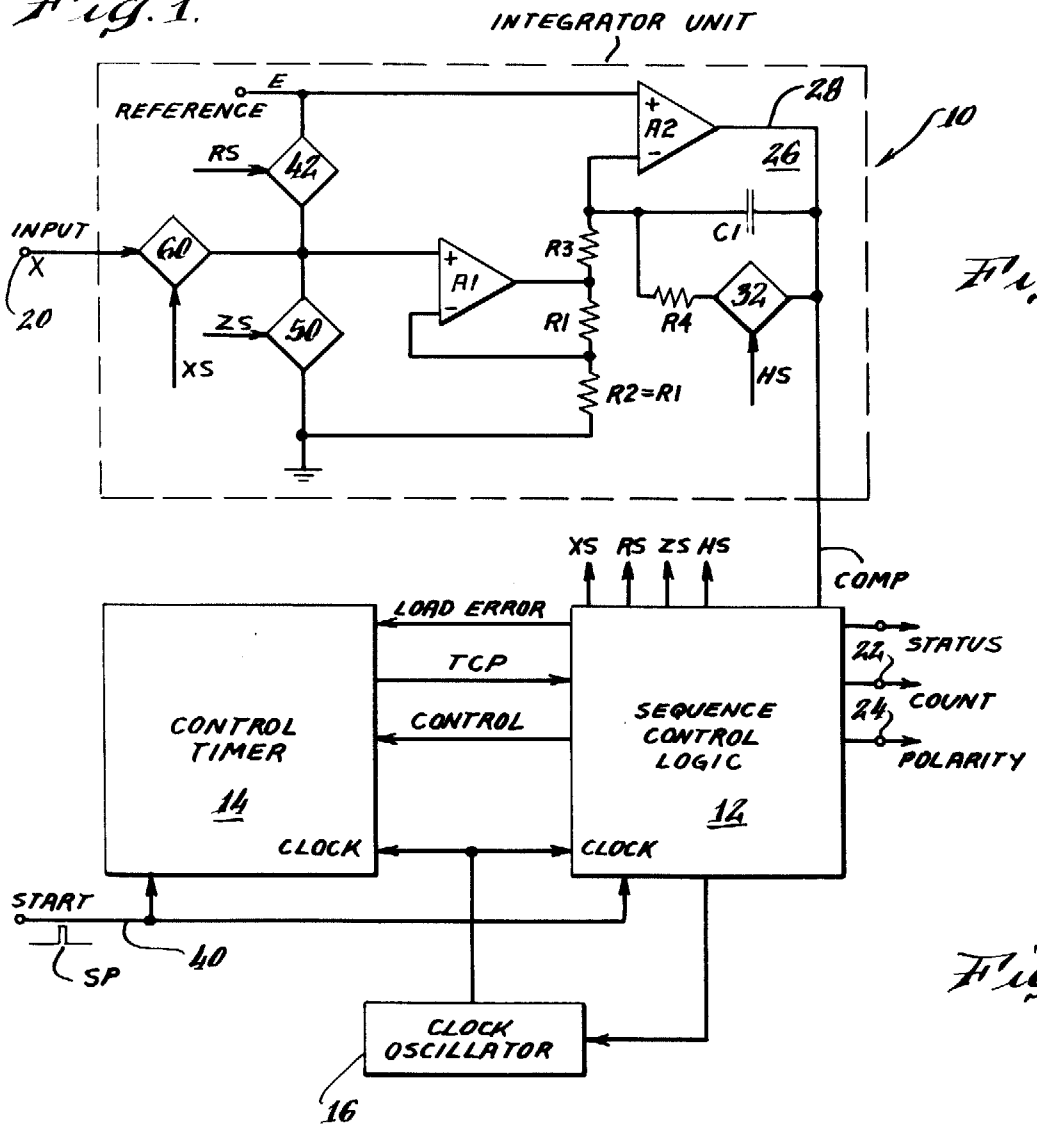
Fig. 1.

DECODER
COUNTER
COUNT=R
COUNT=R-1
RESET
72
74
G3
G2
G1
G6
G5
G4
G7
70
BINARY COUNTER
RESET
2⁰ 2¹ 2² 2³ 2⁴ 2⁵
ERROR REGISTER
(P)
(0)
80
EQUALITY COMPARATOR
84
(1) (1) (0) (1) (1)
EQUAL
FF1
Q
R
D
82
78
START
CLOCK
"B" CONTROL
TCP
LOAD ERROR

INTEGRATING ANALOG-TO-DIGITAL CONVERTER HAVING DIGITALLY-DERIVED OFFSET ERROR COMPENSATION AND BIPOLAR OPERATION WITHOUT ZERO DISCONTINUITY

Matter enclosed in heavy brackets [ ] appears in the original patent but forms no part of this reissue specification; matter printed in italics indicates the additions made by reissue.

BACKGROUND OF THE INVENTION

1. Field of the Invention

This invention relates to analog-to-digital converters. More particularly, this invention relates to electronic converter circuitry which is adapted to provide very accurate conversions and which is particularly suited for economical manufacture utilizing integrated-circuit (IC) techniques.

2. Description of the Prior Art

Analog-to-digital converters of various types have been in use for many years, for exmple, to convert analog measurements and the like into corresponding digital signals appropriate for processing by high-speed digital computers, for activating digital display devices, and so on. Converters of the so-called successive approximation type have found extensive use, particularly in interfacing with digital computers. There also has been considerable use of converters using electronic ramp-signal integrators with clockpulse timing devices for producing a digital count corresponding to the magnitude of an analog signal. In one such integrator-type converter, sometimes referred to as a single-ramp converter, a known reference voltage is integrated, while a counter counts clock pulses, until the integrator output equals the analog signal; the number of counts is proportional to the ratio of the analog signal to the known reference voltage, and the analog signal thus can readily be determined.

There are still other integrator-type converters which carry out multiple (successive) integration ramps during each conversion. In one converter, as shown for example in U.S. Pat. No. 3,051,939, the unknown analog signal is connected continuously to the integrator input, and a known reference signal of opposite polarity is connected intermittently to the integrator input so as to produce a saw-tooth wave (i.e. ramp-up, ramp-down) at the integrator output; by properly controlling the application of the reference signal, the ratio of the ramp-up to ramp-down times can be used to determine the magnitude of the unknown analog signal from the known reference signal.

In another such converter, as shown for example in U.S. Pat. No. 3,316,547, the unknown analog signal is applied, without any reference signal, to the integrator input and the integrator is activated for a fixed time determined by operating a clock counter to full-scale; the analog signal then is disconnected from the integrator input and replaced with a reference signal of opposite polarity to ramp the integrator back to the zero or start level; the counter reading when the zero level is reached indicates the time required to return to the zero level and thereby represents the ratio of the unknown analog signal to the reference signal. Still another multi-ramp converter, shown in U.S. Pat. No. 3,678,506, operates through three successive ramp-slope phases, so as to obtain a particular ramp-rate when passing through the zero level at the end of the conversion cycle.

There are still other types of converters in general use. For additional information, reference may be made to "Electronic Analog/Digital Conversions," by H. A. Schmid (Van Nostrand Reinhold, 1970).

Prior analog-to-digital converters are known to have a variety of significant disadvantages. For example, converters with relatively high accuracy are too costly for many applications. Other less-costly converters provide inferior performance capabilities, particularly error drift with changes in ambient temperature. Certain converter designs also are inappropriate for integrated-circuit manufacture, in part because they require substantial proportions of certain analog-type circuitry which cannot be produced so readily in IC chip format as can digital-type circuitry. Typical commercially-available converters also are not well suited for handling bi-polar input signals because they require the integrator to be able to ramp both in the positive as well as the negative direction with respect to the start level, depending upon the polarity of the analog input signal; this discontinuity at zero level tends to create additional errors and involves the use of special circuitry adding to the cost of the converter.

SUMMARY OF THE INVENTION

In one exemplary embodiment of the present invention, to be described in detail hereinbelow, there is provided an analog-to-digital converter of the electronic integrator type having a number of desirable features. A particularly advantageous feature is that of providing a very accurate conversion from a voltage (or current) to a digital count in the presence of a significant net offset voltage error in the converter circuitry.

In accordance with one aspect of the invention, the integrator first is operated through a preliminary conditioning cycle, comprising successive up-and-down integrations of a reference signal, in order to derive a timed digital measure of the net offset voltage. The results of this preliminary conditioning cycle are then employed to control the integrating action during the subsequent signal-integrating cycle, illustratively by controlling the time of integration of the unknown analog signal. It has been found that application of this principle can reduce substantially the errors normally encountered in conventional integrator-type converters, both with respect to zero stability and, where required, with respect to gain stability.

In accordance with another aspect of the invention, the integrator is operated so as to carry out integration only on one side of a predetermined datum voltage level, e.g., circuit ground. The functioning of the converter is the same for input analog signals of either polarity, and no special means need be provided for sensing the input polarity and switching the converter circuitry accordingly, as in conventional bipolar converters of the dual-slope type. This single-sided integration operation is carried out in such a way that the ramp approach to, and intersection with, the datum level always is from the same direction (i.e., polarity), and always at the same slope. The conversion operation is started in response to the detection of the integrator output crossing the zero line, or datum level, from that same direction and slope. This arrangement reduces errors resulting from variations in response time to the converter components, especially that of the comparator used as a zero-crossing detector.

In general terms, the present invention proceeds on the principle of compensating for potential conversion errors by controlling the "timing" of certain events, rather than by use of the typical analog-type compensation techniques of conventional converters. This timing of events is determined digitally, and, as is well known, high precision is inherently achievable by the use of digital techniques, as compared with analog techniques. The disclosed embodiment particularly provides significantly superior freedom from the effects of comparator response time and integrator response time, i.e. the time required for the integrator to change from a linear ramp in one direction to a linear ramp in the opposite direction.

Accordingly, it is a general object of the present invention to avoid or minimize certain disadvantages of prior art analog-to-digital converters such as described above. A specific object of this invention is to provide converters having high performance capabilities and which can be manufactured at reasonable cost. Other objects, aspects and advantages of the invention will in part be pointed out in and in part apparent from, the following description considered together with the accompanying drawings.

BRIEF DESCRIPTION OF THE DRAWINGS

FIG. 1 is a block diagram showing the overall arrangement of a converter in accordance with this invention;

FIGS. 5 and 6 are timing diagrams illustrating the manner in which the output count is developed.

DESCRIPTION OF THE PREFERRED EMBODIMENT

Figure 2:
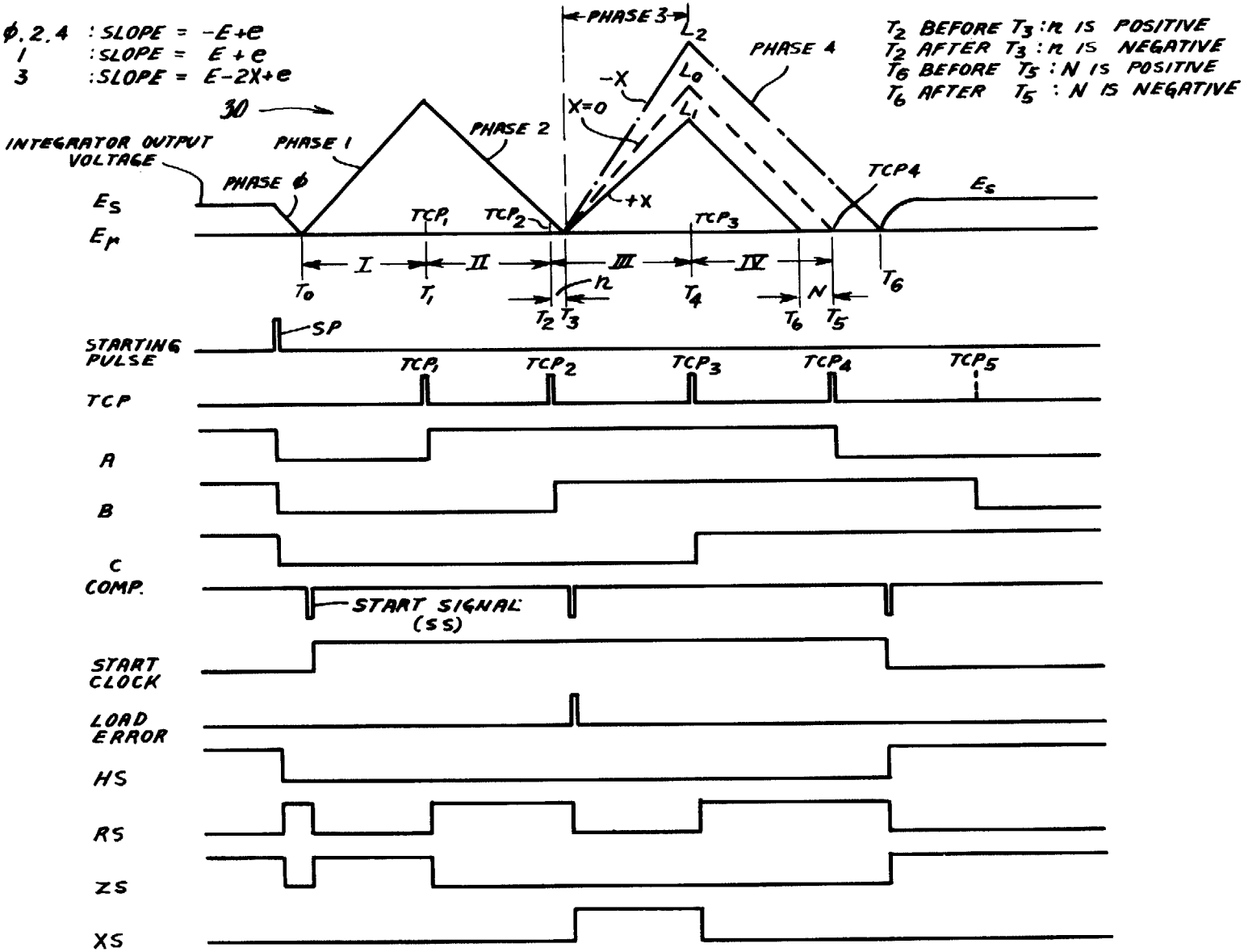
FIG. 2 is a timing diagram showing the time relationships between various events and signals occurring during a typical conversion operation.

Referring now to FIG. 1, the exemplary converter embodying this invention comprises three principal operating components. At the top is an Integrator Unit generally indicated by the dashed-line box 10 and including suitable switching means for directing signals to an electronic integrating circuit as will be described. The various switches are operated by signals from a Sequence Control Logic Unit 12, which cooperates with a Control Timer Unit 14. Both of these control units receive clock pulses from a conventional clock oscillator 16.

The unknown analog signal X is applied to an input terminal 20 at the Integrator Unit 10. The output digital signal is developed at the Sequence Control Logic Unit on an output terminal 22, as a series of clock pulses corresponding in number to the magnitude of the analog signal. The polarity of the analog signal is indicated by a binary signal on an adjacent output terminal 24.

The Integrator Unit 10 includes two operational amplifiers A1, A2, with the latter serving as an integrating circuit 26 by virtue of its negative feedback circuit comprising a capacitor $C_1$ which cooperates with an input resistor $R_3$ to provide a desired RC integrating time-constant.

Amplifier A2 delivers on output line 28 a ramp signal having ramp rate (slope) proportional to the amplifier input signal, and a ramp direction determined by the effective input polarity.

The overall operation of the converter can perhaps best be understood by reference first to the timing diagram of FIG. 2. At the top of the diagram is a graphical representation 30 of the output voltage of the integrating circuit 26 during conversion of positive and negative analog signal to corresponding digital numbers.

Prior to the beginning of the conversion cycle, the integrator output 28 is held at a positive voltage of arbitrary level Es. Various means can be used for this purpose, and, as one example, there is shown a resistor $R_4$ which is connected by a switch 32 between the amplifier output and a series network of resistors $R_1$, $R_2$, $R_3$ leading to circuit ground. With a fixed positive reference voltage E connected to the non-inverting input terminal of amplifier A2, and the inverting-input terminal connected to the junction betwen $R_3$ and $R_4$, the amplifier output will be held fixed at a positive value of Es which is less than E.

Figure 3:
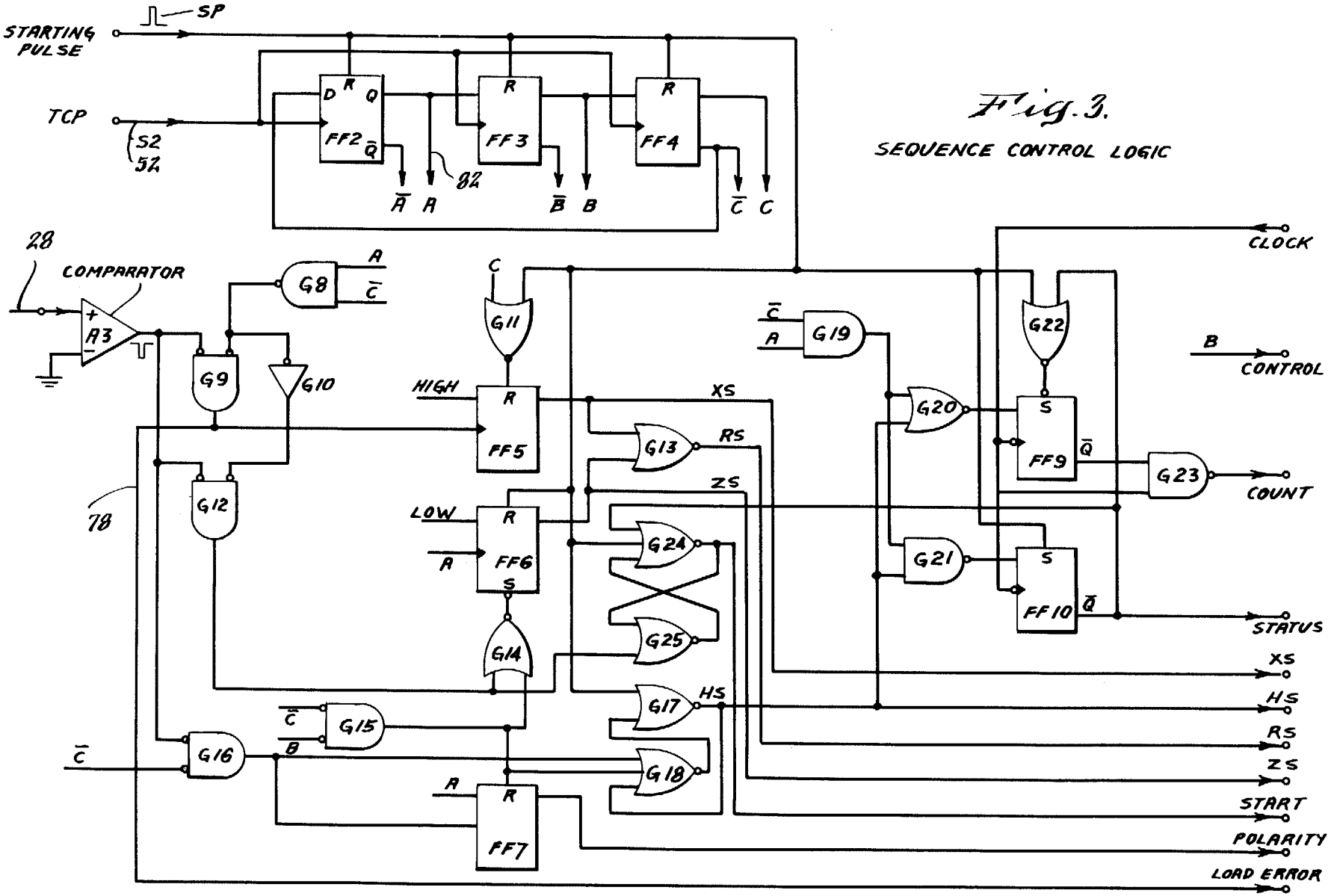
FIG. 3 is a schematic diagram showing details of the Sequence Control Logic Unit.

To begin a conversion cycle, conventional means (not shown) are activated to apply a starting pulse SP to a start-control line 40 (FIG. 1). Referring also to FIG. 3, this pulse activates initializing means to reset (or set) the pertinent control circuit flip-flops (hereinafter referred to as FFs) to predetermined initialized states, and to activate the conversion cycle. The detailed initializing functions of pulse SP include resetting flip-flops FF2 through FF8, setting FF9 and FF10, and resetting the FFs formed by gates G17/G18 and G24/G25.

With G17/G18 reset, the output line HS goes LOW to open switch 32 and release the integrator circuit 26 for ramp action. Since FF5 and FF6 also are reset, gate G13 produces a HIGH signal RS to close one of the integrator input switches 42 to connect the reference voltage E to the non-inverting input of buffer amplifier A1 (FIG. 1). With the inverting input of the amplifier connected to the junction between $R_1$ and $R_2$, having equal ohmic resistances, the buffer output voltage will be 2E. This voltage is directed through input resistor $R_3$ to the inverting input of amplifier A1 (the non-inverting input of which remains held at E). Thus, as shown in FIG. 2, the output of A2 ramps down (i.e., in a negative direction) from Es at a rate proportional to $(-E+e)$, where e is the net offset voltage for the integrating circuitry. This ramp-down is referred to as "phase O."

Referring again to FIG. 3, the integrator output signal on line 28 is directed to the non-inverting input of an amplifier A3 arranged as a comparator, with its inverting input grounded. When the integrator ramp-down signal reaches ground potential (Er in FIG. 2), the comparator develops a "compare" signal to serve as a "start signal" SS to begin the conversion cycle at the start time $T_0$.

The first part of the conversion cycle comprises a pre-conditioning sequence wherein the integrator circuit 26 is operated through two successive time periods, without the analog signal as an input, for the purpose of establishing the total offset error then present in the integrator circuitry. In more detail, the start signal SS is applied to gate G12 the HIGH output of which is directed through gate G14 to set FF6. (Note: The outputs of G9 and G16 do not go high at this time, because control signals A and C are both low.) The setting of FF5 produces a HIGH signal ZS which closes input switch 50 so as to ground the positive input terminal of amplifier A1. Thus the amplifier output goes to zero, and integrator amplifier A2 thereby receives a net positive input voltage E producing a positive (up) ramp as indicated in FIG. 2.

The slope of this up-ramp is proportional to (E+e), where e is the net offset voltage for the integrating circuitry. This up-ramp is continued for a predetermined, fixed period of time established by K clock pulses. As indicated on the graph 30 (FIG. 2), this first conditioning time period is referred to as phase 1.

When the clock oscillator 16 has produced K pulses following time $T_0$, the Control Timer Unit 14 develops (by means to be described below) a timing control pulse TCP1, signifying the end of phase at a time identified as $T_1$. TCP1 is directed through line 52 (FIG. 3) to FF2, causing its output A to go high. (The outputs of FF3 and FF4, i.e., control signals B and C, remain low at this time.) The LOW-to-HIGH transition of control signal A resets FF6, making ZS go LOW and RS go HIGH. Thus, integrator input switch 50 now opens, and input switch 42 closes to apply the reference voltage E to the positive terminal of amplifier A1. The circuit conditions thus are like those during phase O, and the integrator output on line 28 ramps back towards the original datum level Er. This ramping occurs at a slope proportional to (−E+e), and the ramp-down time period is referred to as phase 2.

The Control Timer 14 produces a second control pulse TCP2 at a time $T_2$ corresponding to 2K clock pulses after the start time $T_0$. If the offset error e is negative, the integrator output on line 28 would already have reached the reference voltage Er at this time $T_2$, if e is positive, the down-ramp would still be above the datum level at $T_2$, as shown in FIG. 2, and would continue until the datum level is reached at $T_3$. The time difference between $T_2$ and $T_3$ (referred to as n clock pulses) is an indicator of the magnitude of the net offset voltage. If $T_2$ is before $T_3$, n is positive, and if $T_2$ is after $T_3$, n is negative.

During phase 2, the output of gate G8 will be LOW and the output of gate G10 will be HIGH. Thus, when the integrator output reaches the reference level Er, the resulting "compare" signal causes the output of gate G9 to go HIGH (the outputs of gates G12 and G16 remaining LOW). The HIGH output of G9 sets FF5, making switch signal XS HIGH and switch signal RS LOW. This opens switch 42 and closes switch 60 to connect the unknown analog signal X to the positive input of the buffer amplifier A1. The amplifier output will be 2X and this voltage is directed to amplifier A2 (through input resistor R3) along with the reference voltage E. Since E is chosen to be larger than 2X, for full-scale input, the integrator 26 will now ramp up, at a rate proportional to (E−2X+e).

This up-ramp time period for integrating the analog signal X is referred to as phase 3, and continues until the occurrence of timing pulse TCP3 at $T_4$. The level of integrator output at time $T_4$ reflects the magnitude of the signal. If X is zero, the integrator output level at $T_4$ will be some intermediate value $L_0$ (see graph 30, FIG. 2) determined by the magnitude of the reference voltage E. If X is positive, the integrator output level will be some lower value $L_1$, and if X is negative, the integrator output level will be some higher value $L_2$. In any case, the integrator output level L always will be positive with respect to the datum level Er. It is this characteristic which provides a bipolar input capability without requiring integration in both directions away from the datum level.

In certain popular prior art converters of the so-called dual-slope type, an integrator is arranged to selectively integrate in either direction away from a datum level, in order to handle input signals of either polarity, i.e., bipolar inputs. In such converters, the integrator output at the end of integration directly corresponds to the magnitude of the input signal, and a digital output can be derived by counting the time (clock pulses) required to integrate back to the datum level while using a known reference signal (of selected polarity) as the integrator input.

It will be apparent from the above discussion of the new converter described herein that it functions in a distinctly different manner. It should particularly be noted that in this new converter the integrator output level L does not correspond directly to the magnitude of X, as a consequence of the special arrangement providing for single-polarity (single-direction) integration for input signals of either polarity. Although the integrator output level L does not correspond directly to X, it nevertheless does contain a signal component representing the magnitude (and polarity) of X, and it has been found that this signal component can readily be extracted from the integral output level L to develop the desired digital output, in a manner now to be described.

For this purpose, the integrator circuit 26 is activated at time $T_4$ to ramp back (phase 4) to the datum level, at a ramp rate proportional to (−E+e), i.e., at the same rate as during phase 0 and 2. Simply measuring the number of clock pulses during ramp back, or digitally determining the ratio of the ramp-back time to ramp-up time, as in conventional converters, will not provide the desired digital output number. Instead, in accordance with a further aspect of the present invention, a time period $T_4$–$T_5$ is established, equal to period $T_2$–$T_4$, and the digital output is derived by counting the number of clock pulses N occurring between the time ($T_6$) that the integrator output crosses Er, and the time of occurrence of the last timing control pulse TCP4 at $T_5$. The polarity of N (i.e., the polarity of X) is indicated by which of these two events occurs first. If $T_6$ occurs before $T_5$, N is positive; if $T_5$ occurs after $T_6$, N is positive.

In accordance with particularly significant aspects of the present invention, the converter is operated in such a way that this digital number N will always provide a highly accurate representation of the magnitude of the analog signal X, even in the face of a significant offset error voltage e. In general terms, this result is achieved by controlling the integration action to which X is subjected (phase 3), in accordance with the error signal n determined in phases 1 and 2. Specifically, in the disclosed embodiment, this is effected by automatically adjusting the length of the phase 3 integration time period in accordance with the immediately preceding determination of n.

In one version of the embodiment described herein, the phase 3 integration time period is controlled in a simple fashion by presetting the Controll Timer Unit 14 so as to produce TCP3 at a time ($T_4$) which is 3K clock pulses after $T_0$, and to produce TCP4 at a time ($T_5$) which is 4L clock pulses after $T_0$. Thus, with such an arrangement, the complete conversion operation can be viewed as comprising four equal-duration time periods (I, II, III, IV) following the start time $T_0$. (However, it should be noted that the conversion operation actually may not be completed until after the end of the last time period IV, i.e., with a negative input signal X.) These four equal-spaced time periods can be developed quite readily by using as the TCP pulse generator a straightforward divide-by-K counter to produce a control pulse every K clock pulses.

Since with such an arrangement, all of the time periods I, II, III and IV are pre-set (fixed), it will be apparent that the time of integration of X, during phase 3, is a simple subtractive function of n. That is, X will be integrated (along with E) for a time period equal to (K-n), thereby automatically adjusting the period of X integration in accordance with n. It can be shown that automatically adjusting the integration action in such fashion compensates with exceptional precision for zero offset errors, and also compensates quite well for gain offset errors.

A still further improvement in performance, particularly with respect to gain stability, can be achieved by automatically controlling the durations of time periods III and IV in accordance with the number n, while leaving the time periods I and II fixed. More specifically, this improvement can be achieved by controlling the occurrence of TCP3 and TCP4 such that the periods III and IV are equal in duration to (K+n2) clock pulses, instead of K as in the first-described version. It can be shown that such a control action reduces substantially any variation in output number N caused by a change in the effective offset errors of the converter. Illustrative means for so controlling the respective third and fourth time periods III and IV will be described hereinbelow, together with a description of exemplary circuit means used to carry out the final phases of the conversion and produce the digital count N.

Returning now to the detailed description of the preferred embodiment, and referring again to FIG. 3, the TCP2 pulse (at $T_2$) causes control signal B to go HIGH, and the subsequent TCP3 pulse (at $T_4$) causes C also to go HIGH, so that signals A, B and C are all HIGH at the end of phase 3. Thus, the output of gate G11 goes LOW, resetting FF5 to turn OFF switch signal XS and turn ON switch signal RS. Accordingly, the integrator again reverses direction and starts a down-ramp (phase 4) with a slope (e-E).

With control signal C HIGH, the output of gate G8 is HIGH and the output of gate G10 is LOW. Therefore, when the integrator output reaches the datum level (Er), the outputs of gates G17 and G16 both will go HIGH. This will set FF6 via gate 14 and will also set the FF formed by G17/G18, thus turning on both ZS and HS to restore the integrator output to its initial state, Es.

The output of G19 goes HIGH when TCP4 occurs at time $T_5$, and the output of gate G17 goes HIGH when the comparator produces its compare signal when the integrator signal crosses the datum level Er. Whichever comes first will cause the output of gate G20 to go LOW. When both G17 and G19 go HIGH, the output of gate G21 goes LOW.

The output of G20 is directed to the D-input of FF9 which is clocked on the HIGH-to-LOW transition of the clock pulse. Thus the Q output of FF9 goes HIGH on the first negative clock pulse transition after G20 goes LOW, thereby enabling gate G23 so as to produce on output terminal 22 a series of clock pulses representing the desired digital number. These clock pulses will continue until the first negative clock transition after both TCP4 and the zero-crossing compare signal (at $T_6$) have occurred. At this instant, $\overline{Q}$ output of FF10 goes HIGH, thus resetting FF9 via gate G22, and terminating the output count. The number of clock pulses N delivered to output terminal 22 during this period corresponds to the magnitude of X.

The polarity of the analog signal X is indicated on output terminal 24, in accordance with whether the integrator output crossed Er before or after TCP4. The compare signal activates gate G16, and its HIGH output clocks FF7 which thereupon samples the state of control signal A (at the time $T_6$). If TCP4 has not yet occurred, control signal A will still be HIGH, and the output of FF7 will be HIGH, indicating a positive polarity. If TCP4 has already occurred, control signal A will have gone LOW, and the output of FF7 correspondingly will be LOW, indicating negative polarity.

It may be noted that FF9 and FF10 serve to synchronize the asynchronous firing of the comparator A3. For all inputs, positive or negative, this circuit provides round-up at the half-digit level. For example, for inputs of magnitude less than ½ LSB, no output count will result. If the input is just greater than ½ LSB, one complete output pulse will occur. FIGS. 5 and 6 are timing diagrams illustrating the behavior of the circuit for positive and negative inputs. The "conversion complete" STATUS signal from FF10 in all cases occurs after a complete output-count pulse-train has been issued.

To avoid jitter in the LSB of the conversion, the clock phase should advantageously be synchronized with the start of the conversion. To this end, the FF of G25/G26 is set by the output of gate G12, thus restarting the clock oscillator in phase with the conversion cycle. The clock FF is reset by the STATUS signal at the end of conversion.

Figure 4:
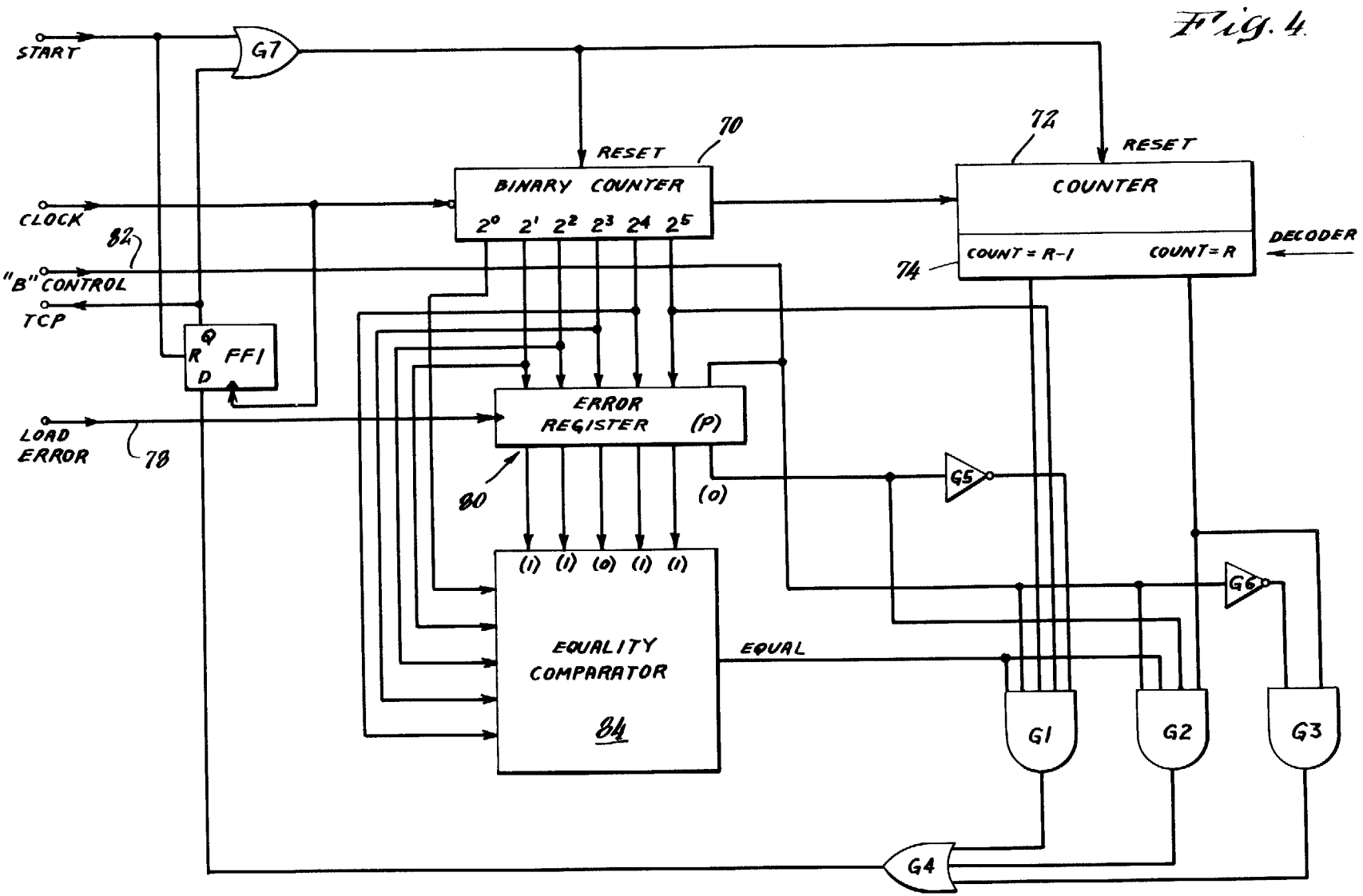
FIG. 4 is a schematic diagram showing details of the Control Timer Unit.

FIG. 4 shows the circuit details of the Control Timer Unit 14 arranged to develop the timing control pulses TCP1, etc., as previously described. This unit includes two cascaded counters 70 and 72. The first is a conventional binary counter, here shown as consisting arbitrarily of 6 bits. The following counter 72, which may count in any convenient code, is provided with a corresponding decoder 74 to produce HIGH outputs whenever the count is either the number R or the number R-1.

Starting with both counters cleared, the second counter 72 receives an input pulse from the first counter 70 every $2^6$ clock pulses. Thus "Count=R" goes HIGH every $2^6 \times R$ clock pulses. When "Count=R" goes HIGH, the output of gate G3 goes HIGH to cause the output of gate G4 also to go HIGH. This occurs on a HIGH-to-LOW clock pulse transition, as indicated by the symbols at the clock input of counter 70.

On the next LOW-to-HIGH clock transition, the Q output of FF1 goes HIGH to produce the TCP1 pulse and reset both counters 70 and 72 via gate G7. This in turn removes the "Count=R" signal from gates G3, G4 and the D input of FF1.

On the next LOW-to-HIGH clock pulse transition, the Q output of FF1 again will go LOW, allowing the count to resume. Thus, after a further $R \times 2^6$ pulses, FF1 will produce TCP2.

It will be apparent that, in this mode, the counters 70 and 72 operate as a simple divide-by-K counter, with $K = 2^6 \times R$, so as to define equal-duration time periods I and II, referred to previously. If the counters were allowed to continue in this mode, two further identical time periods III and IV would be defined by TCP3 and TCP4. As noted hereinabove, the error correction provided by such uniform-time-period operation is quite good, and this approach has the advantage of needing only relatively simple counter circuitry.

However, to achieve even superior error correction, the time durations of period III and IV advantageously are controlled in accordance with the error count developed during periods I and II. To this end, and referring again to FIGS. 2 and 3, at the time $T_3$ (i.e., the time when the integrator output returns to Er), the compare signal from comparator A3 causes gate G9 to develop a "Load Error" signal on a line 78 leading to the Control Timer Unit 14. Now, returning to FIG. 4, it may be seen that this signal, on its LOW-to-HIGH transition, activates an Error Register 80 to load into that register the number then contained in the binary counter 70. The Register 80 also receives at P an additional binary bit indicating the error polarity at $T_3$, as indicated by the condition of control signal B on line 82.

If the control signal B is HIGH at this time ($T_3$), the error is positive, and the number loaded from the counter 70 will be the number n. This number is loaded into Error Register 80 shifted one bit towards the LSB, i.e., the $2^1$ bit of the counter becomes the $2^0$ bit of Register 80, and so on. Accordingly, the number in the counter is divided by two, so that Error Register 80 contains the number n/2.

Because at this time the control signal B is HIGH, gate G3 is disabled by the output of gate G6, and gate G1 is also disabled by the output of Gate 5. Thus neither of gates G1 or G3 can be activated under these conditions to control FF1 for producing TCP3 and TCP4. Instead, control of FF1 is exercised by gate G2, in response to the output of an Equality Comparator 84 and the "Count=R" line from decoder 74.

Equality Comparator 84 compares the contents of the Error Register 80 (i.e., the number n/2) with a digital number comprising the five least significant bits of the number in binary counter 70. After the "Load Error" signal previously referred to, the counter 70 will continue counting through its normal range of $2^6 \times R$ clock pulses. An "equality" HIGH signal will be produced by Comparator 84 each time the number n/2 is passed during this counting, but gate G2 will not turn on because "Count=R" is not also HIGH at these times.

Ultimately, at $2^6 \times R$ clock pulses, "Count=R" will go HIGH. The contents of the binary counter 70 will at this instant be zero, since a carry from this counter just occurred, so that the equality signal from Comparator 84 will be LOW. After a further n/2 clock pulses, the number in counter 70 will be n/2, and the "equality" signal will go HIGH. This HIGH signal, together with the HIGH "Count=R" signal, turns gate G2 on. This in turn causes the output of gate G4 to go HIGH, so as to produce TCP3 from FF1, and reset the counters 70 and 72 which thereupon operate through an identical sequence to produce TCP4. Accordingly, it will be apparent that in this mode of operation, the counters 70 and 72 effectively divide the clock frequency by (K+n/2), thus producing time periods III and IV in accordance with the requirements specified hereinabove.

In the event that phase 2 is completed before the occurrence of TCP2, i.e., if the integrator output reaches Er prior to the end of time period II, the error signal n will be negative. Under these conditions, the durations of the third and fourth time periods III and IV should be shortened, rather than lengthened. For such a negative error correction, the logic circuitry is arranged to use gate G1 to turn on FF1 and produce TCP3 and TCP4, gates G2 and G3 being de-activated in this mode.

Since in this case, the control signal B will still be LOW when the Load Error signal is developed on line 78, the P bit loaded into the Error Register 80 will be LOW, and the output of gate G5 will be HIGH to activate one of the inputs to gate G1. Another of the inputs to gate G1 is connected to the MSB ($2^5$) of the binary counter 70, and thus this lead will go HIGH after 32 clock pulses during each count cycle of 64 pulses. A third input to gate G1 is the "Count=R-1" line from decoder 74, which goes HIGH during the last 64 clock pulses before counter 72 reaches a count of R. A fourth input to gate G1 is the control signal B, which will go HIGH upon the occurrence of TCP2, as described above, terminating the second time period II. The final input to gate G1 is the "equality" signal from Comparator 84.

The number loaded from the counter 70 by the Load Error signal is the actual binary count at that instant. For a negative error, this number, in normal binary notation is not the actual error. However, it should be noted that the number loaded into the Error Register 80, if considered as a binary 2's complement number, does represent the desired error signal. Taking advantage of that fact, the control circuitry is so arranged that, when a negative error has been indicated by the control signal B being LOW at the time of Load Error signal, it will develop the timing control pulse TCP3 at a time which is prior to the completion of the full count of $2^6 \times R$ by an amount equal to the difference between the number loaded into Register 80 and the full count number. That is, as will be apparent from the discussion below, the circuits function as a divide-by-(K−n/2), counter.

To provide an illustrative example, consider that the Error Register 80 is loaded with binary number 11011 (as shown in parenthesis in FIG. 4). This number, considered as 2's complement, is −5 (thus indicating that five additional counts are needed to reach zero). After loading this number, the counters continue to operate, passing through $2^6 \times R$ (whereupon TCP2 is produced and control signal B goes HIGH), and starting over again so as to count into the next time period III. After $2^6$ (R-1) clock pulses, the "Count=R-1" lead will go HIGH at the input to gate G1. After a further 32 clock pulses, the MSB lead ($2^5$) will go HIGH. Thus, at this point in time, all of the gate G1 inputs are HIGH except for the "equality" lead from Comparator 84. This equality signal goes HIGH 27 clock pulses after the MSB lead goes HIGH, i.e., 5 clock pulses prior to the full $2^6 \times R$ count. Stated somewhat differently, gate G1 output goes HIGH after a total number of clock pulses (beyond TCP2) equal to:

$$2^6(R-1)+32+27=2^6R+32+27-64=2^6R-5$$

When the output of gate G1 goes HIGH, FF1 is activated in the usual way to produce TCP3. The counters 70 and 72 then are reset, and proceed through an identical sequence to produce TCP4 such that time period IV is equal in duration to the (shortened) time period III.

In summary, the Control Timer Unit 14, as shown in FIG. 4, operates to lengthen or shorten the intervals $T_2$–$T_4$, $T_4$–$T_5$ (and $T_5$–$T_6$) such as to reduce to minimal levels the effects of drift of amplifiers A1, A2, the comparator A3, and resistors $R_1$, $R_2$. This is achieved in an implicitly digital manner, without the problems of conventional analog-type drift correct circuitry. In addition to correcting for dc errors, the arrangement described also minimizes errors due to response characteristics in the comparator and amplifiers, as previously discussed hereinabove.

The digital output on terminal 22 consists of a train of clock pulses corresponding in number to the analog input signal. This output signal can be used with any convenient counter to totalize the number of pulses. By using the start pulse SP to reset the totalizing counter, the number reached by that counter when the STATUS output goes HIGH is a correct representation of the analog signal, independently of whether the counter counts on positive or negative count transitions, as indicated by FIGS. 5 and 6.

DETAILED THEORY OF OPERATION

Set forth below, as an aid to understanding certain features of the present invention, is a mathematical analysis presently believed to be representative of the relations between the various important elements and parameters of the disclosed apparatus. This analysis refers to the various instants of time ($T_0$, $T_1$, etc.) and time periods identified hereinabove, with particular reference to graph 30 of FIG. 2. To summarize the pertinent instants of time:

| | |
|---|---|
| $T_0$ at $t = 0$: | The instant of time when actual conversion starts. |
| $T_1$ at $t = K1\Delta t$: | The instant of time defined by a Timing Counter having counted K1 clock pulses of period $\psi t$. starting at $t = 0$. |
| $T_2$ at $t = 2K1\Delta t$: | The instant of time defined by the Timing Counter having counted 2K1 clock pulses since starting at $t = 0$. |
| $T_3$ at $t = (2K1 + n)\Delta t$: | The instant of time when the Comparator signals that reference level Er has (again) been reached. |
| $T_4$ at $t = (2K1 + K2)\Delta t$: | The instant of time when the Timing Counter signals that 2K1 + K2 clock pulses have been counted. |
| $T_5$ at $t = (2K1 + 2K2)\Delta t$: | The instant of time when the Timing Counter signals that 2K1 + 2K2 clock pulses have been counted since $t = 0$. |
| $T_6$ at $t = (2K1 + 2K2 - N)\Delta t$: | The instant of time signaled by the Comparator having reached the reference level for the third and final time. |

Note: $T_3$ may occur before or after $T_4$, similarly $T_6$ may occur before or after $T_5$. N and n, which therefore may be positive or negative are shown as positive in the above listing and on FIG. 2.

The conversion consists of the sequential integration of 3 separate signals, which are:

$U = E + e$ $V = -E + e$ $W = E - X + e$

Where E is a reference voltage (or current), X is the unknown voltage (or current) to be converted, and e represents the unavoidable circuit offset voltage (current).

THE CONVERSION SEQUENCE

Phase 1

Phase 1 consists of integration of signal U over the interval $T_0$–$T_1$.

Phase 2

Phase 2 consists of integration of signal V over the interval $T_1$–$T_3$. At the end of Phase 2 we can write the following equation:

$$Er + \int_{T_0}^{T_1} U\,dt + \int_{T_1}^{T_3} V = Er$$

which by substitution for previously defined parameters becomes:

$$\int_0^{K1\Delta t} (E + e)\,dt + \int_{K1\Delta t}^{(2K1 + n)\Delta t} (-E + e)\,dt = 0 \qquad \text{Eq. 1}$$

$$n = \frac{2K1\,e}{E - e}$$

Phase 3

Phase 3 consists of integration of signal W over the interval $T_3$–$T_4$. Phase 4

Phase 4 consists of integration of signal V over the interval $T_4$–$T_6$. At the end of Phase 4 we write the following equation:

$$Er + \int_{T_3}^{T_4} W\,dt + \int_{T_4}^{T_6} V\,dt = Er$$

which by substitution for previously defined parameters becomes:

$$\int_{(2K1 + n)\Delta t}^{(2K1 + K2)\Delta t} (E - X - e)\,dt + \int_{(2K1 + K2)\Delta t}^{(2K1 + 2K2 - N)\Delta t} (-E + e)\,dt = 0$$

Integrating, substituting for n from Eq. 1, and solving for N, we get:

$$N = 1/(E-e)^2[X(K2(E-e) - 2K1e) + 2e^2(K1+K2) + 2eE(K1-K2)] \qquad \text{Eq. 2}$$

For the simplest implementation we make $K1 = K2 = K$, i.e., the Timer Counter is a simple divide-by-K counter. Eq. 2 becomes:

$$N = K/(E-e)^2[X(E-3e) + 4e^2] = K/(1-e/E)^2[X(1 - 3e/E) + 4e^2/E^2]N = K(X(1-3e/E)/(1-e/E)^2 + 4e^2/E2/)1-e/E)^2) \qquad \text{Eq. 3}$$

By series expansion of the two terms, and writing $e/E = \alpha$ we get:

$$N = KX(1 - \alpha - 3\alpha^2 - 5\alpha^3 + \ldots) + 4K(\alpha^2 + 2\alpha^3 = 3\alpha^4 + \ldots) \qquad \text{Eq. 4}$$

Now $\alpha = e/E$ can by adjustment be made equal to zero at room temperature. Also by proper design the error term can be bounded over all normal operating temperatures such as to keep e/E sufficiently small. Then a term $\alpha^2$ would be very much smaller than a term $\alpha$, and a term $\alpha^3$ would be much smaller than a term $\alpha^2$, and we might as a very good approximation write:

$$N \approx KX(1 - \alpha) + 4K\alpha^2 \qquad \text{Eq. 5}$$

Thus, we have a linear transformation from voltage X to count N with gain and offset errors as shown.

This performance of the Converter, although excellent, can be greatly improved as will be shown below:

$$n=2K1e/E-e=2K1e/E1-e/E \quad \text{Eq. 1}$$

First, by series expansion of Eq. 1, we have $$n=(\alpha+\alpha^2+\alpha^3+\ldots)2K1 \text{ when } \alpha=e/E$$

which, by the arguments given previously, we can write $$n\approx 2K1\alpha$$

or $$n/1\approx K1e/E \quad \text{Eq. 6}$$

Thus, we see that at the beginning of Phase 3 of the conversion, we have a very good measurement of the error term n, and it becomes possible to compensate for the gain error due to $\alpha$ (see Eq. 5). Now, by developing Eq. 2, we have:

$$N=X/EK2(1-e/E)-2K1e/E(1-e/E)^2+2e^2/E^2(K1+K2)/(1-e/E)^2+2e/E(K1-K2)/(1-e/E)^2$$

If we make $K2=(1+e/E)K1$ and substitute in the above; we then get:

$$N=X/EK1(1-e^2/E^2)-2K1e/E/(1-e/E)^2+2e^2/E^2K1(2+e/E)/(1-e/E)^2-2e^2/E^2K1(1-e/E)^2$$

Using the notation $\alpha=e/E$, this becomes $$N=X/EK1\ 1-2\alpha-\alpha^2/1-2\alpha+\alpha^2+K1(2\alpha^2+2\alpha^3)/1-2\alpha+\alpha^2$$

which, by series expansion, becomes $$N=N/EK1(1-2\alpha^2-4\alpha^3-\ldots)+K1(2\alpha^2+2\alpha^3+\ldots)$$

And since as previously argued we can make $\alpha$ very small, we has as a very good approximation:

$$N\approx X/EK1(1-2\alpha^2)+K12\alpha^2 \quad \text{Eq. 7}$$

We achieve this superior result by making $K2=K1(1+e/E)=K1+K1e/E$ Returning to Eq. 6, we see that this becomes $$K2=K1+n/2 \quad \text{Eq. 8}$$

Thus, by having an estimate of n at the end of Phase 2, we can modify that Timer Counter Division ratio according to Eq. 8 for the rest of the conversion. This will reduce the previous gain error factor to the same level as the zero offset error factor.

It should be understood that the above mathematical analysis presents a strictly theoretical treatment of the pertinent factors, and that it is necessarily based upon certain approximations and assumptions such as are noted in the analysis. Thus, although the results are believed to provide a validly realistic presentation of the converter characteristics, it must be recognized that in any practical embodiment of the invention actual performance may deviate from theoretical performance. Accordingly, no representation is made herein that the above mathematical analysis is necessarily fully descriptive of all aspects of all types of apparatus embodying this invention. Rather, this analysis is intended to provide supplemental information to enable a better understanding of the manner in which the disclosed embodiment operates.

It also is desired to stress that the detailed description hereinabove of a presently preferred embodiment is presented for the purpose of illustrating the invention, and is not to be construed or understood as limiting the scope of the invention to the particular circuits, devices and/or combinations of elements disclosed herein. To the contrary, it is clear that there are many different possible ways of carrying out or embodying the invention, and those skilled in this art are readily capable of selecting any of a variety of arrangements which best suits a specific application, based upon an understanding of the inventive concepts as disclosed above and claimed hereinafter.

I claim:

1. An analog-to-digital converter comprising:

an integrator arranged to produce ramp signals at rates corresponding to the magnitude of signals applied to the input thereof, the ramp direction being determined by the polarity of the applied signal;

means to condition said integrator to start integrating from a predetermined output datum level at a start time;

means to supply reference signals of opposite effective polarity for application to the input of said integrator;

clock means for producing clock pulses and successive timing control pulses following said start time;

switch means for applying signals to the input of said integrator;

first means to operate said switch means at said start time to apply to said integrator one of said reference signals in a given polarity to cause said integrator to ramp away from said datum level for a first time period as measured by said clock means;

second means to operate said switch means subsequent to said first time period to apply to the input of the integrator one of said reference signals of polarity opposite to said given polarity to cause said integrator to ramp back towards said datum level during a second time period;

a comparator coupled to the output of said integrator for producing a compare signal when said integrator output returns to said datum level, thereby signalling the end of said second time period;

third means responsive to the development of said compare signal at the end of said second time period for activating said switch means to apply to said integrator input for a third time period a composite signal including one of said reference signals and the unknown analog signal which is to be converted to a digital signal, said third time period being terminated upon the occurrence of a first one of said timing control pulses;

means operable at the termination of said third time period for applying to the input of said integrator one of said reference signals of polarity opposite to that of said composite signal, thereby to ramp said integrator output back towards said datum level during a fourth time period; and digitizing means coupled to the output of said comparator and to said clock means for producing an output digital signal representing the number of clock pulses occurring between the appearance of a second one of said timing control pulses and the development by said comparator of a compare signal signalling the end of said fourth time period.

2. Apparatus as claimed in claim 1, wherein said reference signals are of equal magnitude.

3. Apparatus as claimed in claim 1, including means to produce an error signal indicating the difference in time between the end of said second time period and the occurrence of a third timing control pulse preceding said first timing control pulse; and means responsive to said error signal for controlling the timing of occurrence of said first timing control pulse so as to minimize the output error due to changes in effective gain of the converter.

4. Apparatus as claimed in claim 3, wherein the time duration of said first time period is equal to the time between the beginning of said second time period and the occurrence of said third timing control pulse.

5. An analog-to-digital converter comprising:

an integrator arranged to produce ramp signals at ramp rates corresponding to the magnitude of signals applied to the input thereof, the ramp direction being determined by the polarity of the applied signal;

means to condition said integrator to start integrating from a predetermined datum level;

means to supply reference signals of opposite effective polarities for application to the input of said integrator;

clock means for producing clock pulses;

switch means for applying signals to the input of said integrator;

first means to operate said switch means to aply to said integrator one of said reference signals in a given polarity for a first time period as measured by said clock means;

second means to operate said switch means subsequent to said first time period to apply to the input of said integrator one of said reference signals of polarity opposite to said given polarity to cause said integrator to ramp back towards said datum level during a second time period;

a comparator coupled to the output of said integrator for producing a compare signal when said integrator output returns to said datum level, thereby signalling the end of said second time period;

third means to operate said switch means to apply signals to the input of said integrator for two additional successive time periods with the signals applied thereto being of different polarity;

said third means including means to apply the unknown analog signal to said integrator input during one of said additional time periods, and to apply a reference signal to said integrator input during the other time period;

said third means further including means to adjust the duration of said one additional time period in accordance with the amount of time between the occurrence of said compare signal, at the end of said second time period, and the occurrence of a predetermined clock produced by said clock means; and digitizing means coupled to the output of said comparator and to said clock means for producing an output digital signal representing the magnitude of said unknown analog signal in accordance with the integral signal developed by said integrator during said one additional time period.

6. Apparatus as claimed in claim 5, wherein said reference signals are of equal magnitude;

said first time period being equal in duration to the time between the beginning of said second time period and the occurrence of said predetermined clock pulse.

7. In an analog-to-digital converter wherein an electronic integrator is operated through a cycle of two successive time periods so as to ramp in one direction away from a datum level and then return to the datum level, the unknown analog signal being applied as an input to the integrator during at least one of said time periods so that the integration action during that one period is responsive to the magnitude of the unknown signal; there further being included clock means for determining time durations and for developing digital output signals responsive to the magnitude of integrated output produced by the integrator with the unknown analog signal applied thereto for a particular period of time;

that improvement, for minimizing the effects of offset errors and the like occurring in the integrator and/or associated circuitry, which comprises:

means to condition said integrator to start integrating from a predetermined datum level at a start time;

a source of reference signals of opposite polarities for application to said integrator;

switch means for applying signals to the input of said integrator;

first means to operate said switch means to apply a reference signal to said integrator in a given polarity for a first predetermined fixed time period;

second means to operate said switch means subsequent to said first time period to apply to the input of said integrator a reference signal of polarity oposite to said given polarity to cause said integrator to ramp back towards said datum level during a second time period;

a comparator coupled to the output of said integrator for producing a compare signal when said integrator output returns to said datum level, thereby signalling the end of said second time period;

means operable thereafter to cycle said converter through said two successive time periods for producing a digital output; and means for adjusting the integration action of said integrator during said one of said two successive time periods in accordance with changes in the length of time between the development of said compare signal and the end of a second predetermined fixed time period following said first fixed time period.

8. Apparatus as claimed in claim 7, wherein said adjusting means comprises means to alter the time duration of said one of said two successive time periods.

9. Apparatus as claimed in claim 8, wherein said unknown analog signal is applied to said integrator during the first of said two successive time periods;

said adjusting means comprising means responsive to said compare signal for starting said first of said successive time periods; and means responsive to said clock means for ending said first of said successive time periods.

10. Apparatus as claimed in claim 9, including means responsive to said length of time between the development of said compare signal and the end of said second fixed time period for selecting a particular clock pulse for ending said first of said successive time periods.

11. Apparatus as claimed in claim 7, wherein said adjusting means comprising means responsive to the number of clock pulse occurring between said compare signal and the end of said second fixed time period, whereby to provide a digital adjustment of the integration action.

12. An analog-to-digital converter comprising:

an integrator;

means to operate said integrator from a start time through an operating cycle comprising two successive time periods where the integrator is caused to ramp first in one direction for a predetermined time duration, and then to ramp in the opposite direction;

means to apply to the integrator input during the first period, of predetermined duration, a reference signal of one polarity together with an unknown analog signal for a predetermined time duration;

means to apply to the integrator during the second period a reference signal of polarity opposite to said one polarity, thereby to ramp said integrator in the opposite direction back towards said datum level;

a comparator coupled to the output of said integrator to produce a compare signal when the output of the integrator returns to said datum level;

clock means for developing a timing control pulse at a predetermined time subsequent to the end of said first time period; and digitizing means coupled to said clock means and controlled by said comparator output to produce a digital output signal representing the number of clock pulses between said timing control pulse and the occurrence of said compare signal.

13. Apparatus as claimed in claim 12, including;

initializing circuit means operable prior to said start time to set the output of said integrator at a level which is offset from said datum in said one direction;

said initializing means including means to ramp said integrator in said opposite direction, towards said datum level;

signal-producing means responsive to the output of said comparator when said integrator output reaches said datum level in response to the operation of said initializing means, to produce a start signal to signify the start time for said converter; and means operable by said start signal for activating said converter through said operating cycle.

14. Apparatus as claimed in claim 13, including;

pre-conditioning means responsive to said start signal to operate said integrator through a conditioning cycle preceeding said operating cycle;

said pre-conditioning means including means to apply a reference signal of one polarity to said integrator to cause it to ramp in said one direction away from said datum level for one conditioning time period and thereafter to apply a reference signal of opposite polarity to cause it to ramp back to said datum level in said opposite direction for a second conditioning time period; and means responsive to the output of said comparator, when said integrator output reaches said datum level, for initiating said operating cycle.

15. Apparatus as claimed in claim 14, wherein said pre-conditioning means includes means to activate the function of said clock means at the beginning of said conditioning cycle; and means responsive to a particular clock pulse from said clock means for terminating said first operating time period, whereby the time duration of said first operating time period is affected by the length of time between said start signal and the time of said compare signal at the end of the second conditioning time period.

16. Apparatus as claimed in claim 15, including means for developing an error signal responsive to the time difference between the occurrence of said compare signal, at the end of said second conditioning time period, and the end of a fixed time period following the start of said second conditioning time period; and control means responsive to said error signal for selecting the time of said particular clock pulse which terminates said first operating time period.

17. Apparatus as claimed in claim 16, wherein said first conditioning-time period encompasses $K_1$ clock pulses, said fixed time period thereafter also encompasses $K_1$ clock pulses, and there are n clock pulses between the occurrence of said compare signal and the end of said fixed time period;

said control means serving to set at $K_1+n/2$ clock pulses the length of said first operating time period and the length of the period between the start of said second operating time period and the occurrence of said timing control pulse following the start of said second operating time period.

18. In the art of transforming an unknown analog signal into a corresponding digital signal wherein a converter is operated through a measurement cycle comprising a measurement time period during which the unknown analog signal is applied to an integrating circuit to cause the integrating circuit to ramp away from a datum level at a ramp rate related to the analog signal magnitude and a clock generator is operated to produce a digital signal responsive to the amount of accumulated integration during that time period;

the improvement for minimizing the amount of error resulting from offset, and the like, in the integrating circuit, comprising the method of operating the integrating circuit prior to the application of said unknown analog signal by:

applying a reference signal having a given polarity to said integrating circuit for a first preliminary time period to cause said integrating circuit output to ramp away from a datum level;

applying to said integrating circuit during a second preliminary time period, following said first time period, a second reference signal having a polarity opposite to said given polarity to return the said integrating circuit output back to said datum level; and thereafter operating said integrating circuit through said measurement cycle with the integration action thereof controlled in accordance with the length of time between said return of said integrating circuit output to said datum level and the end of a predetermined time period following the end of said first time period to compensate for changes in offset error *and the like* evidenced by said length of time.

19. The method of claim 18, wherein said integration action during said measurement cycle is controlled by adjusting the length of time of said measurement time period.

20. The method of claim 18, wherein said first and second time periods are of pre-set (fixed) duration;

said integration action being controlled by starting said measurement time period in response to the return of said integration circuit output to said datum level, and ending said measurement time period at a predetermined time duration following the end of said second preliminary time period.

21. The method of claim 20, wherein said predetermined time duration is automatically controlled in accordance with the length of time between said return of said integrating circuitry to said datum level and the end of said predetermined time period following the end of said first time period.

22. In an analog-to-digital converter of the type having an integrator adapted to be ramped up-and-back in one polarity region with respect to a datum level by applying to said integrator successive signals including at least one reference signal and the unknown analog signal; comparator means coupled to the integrator output to detect when the output signal has returned to datum level; clock-pulse means for measuring time intervals and developing the desired digital number; control circuit means for controlling the functioning of the integrator and the clock-pulse means; and means coupling the output of said comparator means to said control circuit means for applying thereto a controlling logic signal when said integrator output reaches datum level at the end of said down-ramp during the conversion operation;

that improvment in said converter comprising:

first means operable prior to a conversion operation to set the integrator output at a predetermined level which is offset from said datum level in the same polarity region as said up-and-back ramp;

second means responsive to a start signal for causing said integrator output to ramp from said predetermined level towards said datum level; and third means responsive to the output of said comparator means when said integrator output reaches datum level while under control of said second means, said third means including means for initiating a conversion operation.

23. Apparatus as claimed in claim 22, wherein said third means includes means to initiate a count of clock pulses from said clock-pulse means.

24. Apparatus as claimed in claim 22, wherein means are included to produce said up-ramp by applying thereto said unknown analog signal and to produce said down-ramp by applying said reference signal to said integrator.

25. Apparatus as claimed in claim 24, wherein said second means comprises means for applying said reference signal to said integrator to ramp the integrator output towards said datum level at the same ramp-rate as the down-ramp during the conversion operation.

26. Apparatus as claimed in claim 22, wherein said third means comprises means to operate said integrator first through a pre-conversion cycle in which the integrator is ramped up-and-back by successive, opposite-polarity reference signals for the purpose of determining the net error in the system, and then to operate said integrator through a conversion cycle in which the integrator is ramped up by the unknown analog signal and then back to datum by the same reference signal applied to the integrator for producing ramp-back during said pre-conversion cycle.

27. Apparatus as claimed in claim 26, wherein said second means includes means to apply said same reference signal to said integrator to cause it to ramp towards datum, whereby the ramp-back towards datum is always at the same rate for all functions of said integrator, so as to minimize errors due to response time of the comparator means.

28. In the art of transforming an unknown analog signal into a corresponding digital signal wherein during a measurement cycle the unknown analog signal and a reference signal are controllably applied to an integrator to cause its output to ramp first in one direction away from a datum level and then to ramp back towards said datum level, there being also included clock-pulse means for timing the operation of the integrator and for producing a digital output signal according to time measurements indicating the magnitude of said unknown analog signal as reflected by the amount of accummulated integral during the period said integrator is operated under control of said unknown analog signal;

the improved technique for reducing the amount of error in said output signal resulting from system offsets and the like comprising the method of operating said integrator through a pre-conversion cycle prior to said measurement cycle wherein reference signal means without said unknown analog signal are applied to said integrator so as to cause the output thereof to ramp away from datum level and then to ramp back to said datum level to develop a digital measure of offset error as indicated by the clock-pulse time between (1) the time of return to said datum level and (2) a predetermined time following start of said pre-conversion cycle; and thereafter operating said integrator through said measurement cycle with the integration action thereof controlled in accordance with said clock-pulse time developed during said pre-conversion cycle so as to alter the digital output signal in correspondence to the amount of offset error.

29. The method of claim 28, wherein said integration action during said measurement cycle is controlled by adjusting the length of time said unknown analog signal is applied to said integrator.

30. The method of claim 28, wherein during said measurement cycle the ramp-up of said integrator is produced by applying said unknown analog signal to said integrator and said ramp-back is effected by applying a reference signal to the integrator, the digital output signal being developed in accordance with the number of clock pulses between (1) the return to datum during said measurement cycle and (2) a reference time following the start of said measurement cycle;

said integration action being controlled at least in part by starting said measurement cycle in response to the return of said integrator output to datum level at the end of said pre-conversion cycle, and ending said measurement time period at a predetermined time duration following the end of said pre-conversion cycle.

31. The method of claim 30, wherein said time duration is determined by said clock-pulse time developed during said pre-conversion cycle, whereby the integration action is controlled by adjusting both the start and ending times of integration of said analog signal in accordance with the digitally measured offset error.

32. The method of claim 30, including the step of automatically controlling the time duration between the end of said ramp-up during the measurement cycle and the occurrence of said reference time, in response to the clock-pulse time, previously determined during said pre-conversion cycle.

33. The method of claim 30, wherein the ramp-up during said pre-conversion cycle is produced by applying a reference signal to said integrator for a fixed period of time.

*34. A method of transforming an unknown analog signal into a corresponding digital signal wherein during a measurement cycle the unknown analog signal and a reference signal are controllably applied to an integrator to cause its output to ramp first in one direction away from a datum level and then to ramp back to said datum level, there being also included clock-pulse means for timing the operation of the integrator and for producing a digital output signal according to measurements by said clock-pulse means of the time difference between (a) the time said integrator output returns to datum level and (b) a reference time, said time difference indicating the magnitude of said unknown analog signal as reflected by the amount of accummulated integral during the period said integrator is operated under control of said unknown analog signal, and wherein, for reducing the amount of error in said output signal resulting from system offsets, said integrator first is operated through a pre-conversion cycle prior to said measurement cycle wherein reference signal means without said unknown analog signal are applied to said integrator so as to cause the output thereof to ramp away from the datum level and then to ramp back to said datum level to develop a digital measure of offset error as indicated by the clock-pulse time between (1) the time of return to said datum level and (2) a predetermined time following start of said pre-conversion cycle; and said integrator thereafter is operated through said measurement cycle with said time difference being determined not only in accordance with the value of said analog signal applied to said integrator but also in accordance with said clock-pulse time developed during said pre-conversion cycle so as to alter the digital output signal in correspondence to the amount of offset error.*

*35. The method claimed in claim 34, wherein said time difference is controlled by varying the integration action of said integrator during said measurement cycle in accordance with the clock-pulse time developed during said pre-conversion cycle.*

*36. The method claimed in claim 35, wherein said integration action during said measurement cycle is controlled by adjusting the length of time said unknown analog signal is applied to said integrator.*

*37. Apparatus for transforming an unknown analog signal into a corresponding digital signal wherein during a measurement cycle the unknown analog signal and a reference signal are controllably applied to an integrator to cause its output to ramp first in one direction away from a datum level and then to ramp back to said datum level, there being also included clock-pulse means for timing the operation of the integrator and for producing a digital output signal according to time measurements by said clock-pulse means of the time difference between (a) the time said integrator output returns to datum level, and (b) a reference time, said time difference indicating the magnitude of said unknown analog signal as reflected by the amount of accumulated integral during the period said integrator is operated under control of said unknown analog signal; said apparatus comprising:*

*first means for operating said integrator through a pre-conversion cycle prior to said measurement cycle wherein reference signal means without said unknown analog signal are applied to said integrator so as to cause the output thereof to ramp away from datum level and then to ramp back to said datum level to develop a digital measure indicated by the clock-pulse time between (1) the time of return to said datum level and (2) a predetermined time following start of said pre-conversion cycle; and*

*second means for operating said integrator through said measurement cycle while controlling said time difference both in accordance with the value of said analog signal applied to said integrator and in accordance with said clock-pulse time developed during said pre-conversion cycle so as to automatically adjust the digital output signal in correspondence thereto.*

*38. In an analog-to-digital converter of the type having an integrator adapted to be ramped up-and-back in one polarity region with respect to a datum level by applying to said integrator successive signals including at least one reference signal and an unknown analog signal; comparator means coupled to the integrator output to detect when the output signal has returned to datum level; clock-pulse means for measuring time intervals; control circuit means for controlling the functioning of the integrator and the clock-pulse means; and means coupling the output of said comparator means to said control circuit means for applying thereto a controlling logic signal when said integrator output reaches datum level at the end of said down-ramp during the conversion operation;*

*that improvement in said converter comprising:*

*first means operable prior to a conversion operation to offset the integrator output from said datum level in the same polarity region as said up-and-back ramp;*

*second means responsive to a start signal for causing said integrator output to ramp from its offset value towards said datum level; and*

*third means responsive to the output of said comparator means when said integrator output reaches datum level while ramping from said offset value, said third means including means for initiating a conversion operation.*

*39. Apparatus as claimed in claim 38, wherein the slope of the ramp from said offset value towards said datum level is equal to the slope of said down-ramp during said conversion operation.*

*40. In an analog-to-digital converter of the type having an integrator adapted to be ramped up-and-back in one polarity region with respect to a datum level by applying to said integrator successive signals including at least one reference signal and an unknown analog signal; means to produce a start signal to initiate operation of the converter including such up-and-back ramp; comparator means coupled to the integrator output to detect when the output signal has returned to datum level; clock-pulse means for measuring time intervals; control circuit means for controlling the functioning of the integrator and the clock-pulse means; and means coupling the output of said comparator means to said control circuit means for applying thereto a controlling logic signal when said integrator output reaches datum level at the end of said down-ramp during the conversion operation;*

*that improvement in said converter comprising:*

*first means operable prior to a conversion operation to offset the integrator output from said datum level to an arbitrary predetermined value in the same polarity region as said up-and-back ramp;*

*second means operable after said first means and responsive to said start signal while said integrator output is offset to said predetermined value for causing said integrator output to ramp from said offset value towards said datum level; and*

*third means responsive to the output of said comparator means when said integrator output reaches datum level while ramping back from said offset value in response to said start signal, said third means including means for initiating operation of said converter to carry out a conversion operation.*

*41. Apparatus as claimed in claim 40, wherein the slope of the ramp from said offset value towards said datum level is equal to the slope of said down-ramp during said conversion operation.*

*42. Apparatus as claimed in claim 40, wherein said third means includes error-correction means to perform an error-correction function preceding said conversion operation;*

*said error-correction means including means to ramp said integrator up-and-back in a predetermined fashion in said one polarity region; and*

*means responsive to the output of said comparator when said integrator reaches datum level while ramping back while performing said error-correction function, to initiate said conversion operation.*

*43. Apparatus as claimed in claim 42, wherein the slope of the down-ramp of said integrator remains the same for: (1) the pre-operation down-ramp from said arbitrary offset value, (2) the down-ramp during said error-correction function, and (3) the down-ramp during said conversion operation.*

* * * * *